(12) United States Patent
Vyvoda et al.

(10) Patent No.: US 6,768,661 B2
(45) Date of Patent: Jul. 27, 2004

(54) MULTIPLE-MODE MEMORY AND METHOD FOR FORMING SAME

(75) Inventors: Michael A. Vyvoda, San Jose, CA (US); Christopher S. Moore, San Jose, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 10/184,578

(22) Filed: Jun. 27, 2002

(65) Prior Publication Data

US 2004/0001348 A1 Jan. 1, 2004

(51) Int. Cl.$^7$ .............. G11C 5/02; G11C 5/06; G11C 16/04
(52) U.S. Cl. .............. 365/51; 365/53; 365/185.05
(58) Field of Search .............. 365/51, 63, 195, 365/185.05, 185.33

(56) References Cited

U.S. PATENT DOCUMENTS

| | | | |
|---|---|---|---|
| 5,029,125 A | 7/1991 | Sciupac | 365/218 |
| 5,249,282 A | 9/1993 | Segers | 365/200 |
| 5,285,323 A | 2/1994 | Hetherington et al. | 711/122 |
| 5,515,333 A | 5/1996 | Fujita et al. | 365/200 |
| 5,561,622 A | 10/1996 | Bertin et al. | 365/51 |
| 5,699,317 A | 12/1997 | Sartore et al. | 365/230.06 |
| 5,721,862 A | 2/1998 | Sartore et al. | 365/189.04 |
| 5,812,418 A | 9/1998 | Lattimore et al. | 716/8 |
| 5,818,748 A | 10/1998 | Bertin et al. | 365/51 |
| 5,835,396 A | 11/1998 | Zhang | 365/51 |
| 5,856,221 A | 1/1999 | Clementi et al. | 438/258 |
| 5,889,694 A | 3/1999 | Shepard | 365/105 |
| 5,911,104 A | 6/1999 | Smayling et al. | 438/202 |
| 6,034,882 A | 3/2000 | Johnson et al. | 365/51 |
| 6,104,628 A | 8/2000 | Sugibayashi | 365/51 |
| 6,124,157 A | 9/2000 | Rahim | 438/201 |
| 6,131,140 A | 10/2000 | Rodgers et al. | 711/104 |
| 6,185,122 B1 | 2/2001 | Johnson et al. | 365/51 |
| 6,207,991 B1 | 3/2001 | Rahim | 257/326 |
| 6,208,545 B1 | 3/2001 | Leedy | 365/51 |
| 6,259,132 B1 | 7/2001 | Pio | 257/315 |
| 6,263,398 B1 | 7/2001 | Taylor et al. | 711/3 |
| 6,266,272 B1 | 7/2001 | Kirihata et al. | 365/185.08 |
| 6,324,093 B1 | 11/2001 | Perner et al. | 365/171 |
| 6,378,118 B1 | 4/2002 | Sugibayashi | 716/8 |
| 6,420,215 B1 * | 7/2002 | Knall et al. | 438/131 |
| 6,424,581 B1 * | 7/2002 | Bosch et al. | 365/195 |
| 6,515,888 B2 | 2/2003 | Johnson et al. | 365/130 |
| 6,515,923 B1 | 2/2003 | Cleeves | 365/201 |
| 6,545,891 B1 * | 4/2003 | Tringali et al. | 365/51 |
| 6,545,898 B1 | 4/2003 | Scheuerlein | 365/94 |

OTHER PUBLICATIONS

"MultiMediaCard System Specification Version 2.2 Official Release," pp. 10, 12, and 14, Jan. 2000.

"A 10ns Read and Write Non–Volatile Memory Array Using a Magnetic Tunnel Junction and FET Switch in each Cell," Scheuerlein et al., ISSCC 2000/Session 7/TD: Emerging Memory & Device Technologies/PAper TA 7.2, 4 pages, Feb. 8, 2000.

(List continued on next page.)

*Primary Examiner*—Trong Phan
(74) *Attorney, Agent, or Firm*—Brinks Hofer Gilson & Lione

(57) ABSTRACT

A multiple-mode memory includes a three-dimensional array of word lines, bit lines and memory cells. The memory cells are arranged in multiple vertically stacked layers. In some layers the memory cells are implemented as field-programmable write-once memory cells, and in other layers the memory cells are implemented as field-programmable re-writable memory cells. In this way, both re-writability and permanent data storage are provided in an inexpensive, single-chip solution. Additional types and numbers of types of memory cells can be used.

28 Claims, 3 Drawing Sheets

OTHER PUBLICATIONS

"A 125mm$^2$/Gb NAND Flash Memory with 10MB/s Program Throughput," Nakamura et al., ISSCC 2002/Session 6/SRAM and Non–Volatile Memories/6.4, 10 pages (Dec. 4, 2002).

"Three–Dimensional Memory Array and Method of Fabrication," Johan Knall, U.S. app. Ser. No. 09/560,626 filed Apr. 28, 2002.

"Method for Deleting Stored Digital Data from Write–Once Memory Device," Christopher S. Moore, Derek J. Bosch, Daniel C. Steere, J. James Tringali, U.S. patent application Ser. No. 09/638,439 filed Aug. 14, 2002.

"Memory Device with Row and Column Decoder Circuits Arranged in a Checkerboard Pattern under a Plurality of Memory Arrays," Roy E. Scheuerlein, U.S. patent application Ser. No. 09/896,814 filed Jun. 29, 2001.

"Memory Devices and Methods for Use Therewith," Roger W. March, Christopher S. Moore, Daniel Brown, Thomas H. Lee, Mark G. Johnson, U.S. patent application Ser. No. 09/748,589 filed Dec. 22, 2000.

"Method for Reading Data in a Write–Once Memory Device Using a Write–Many File System," Christopher S. Moore, J. James Tringali, Roger W. March James E. Schneider, Derek J. Bosch, Daniel C. Steere, U.S. patent application Ser. No. 09/878,138 file Jun. 8, 2001.

"Method for Re–Directing Data Traffic in a Write–Once Memory," J. James Tringali, Christopher S. Moore, Roger W. March, James E., Schneider, Derek J. Bosch, Daniel C. Steere, U.S. Patent Application Ser. No. 09/877,691 filed Jun. 8, 2001.

"Memory Device and Method for Storing and Reading Data in a Write–Once Memory Array," Christopher S. Moore, James E. Schneider, J. James Tringali, Roger W. March, U.S. Patent Application Ser. No. 09/877,719 filed Jun. 8, 2001.

"Memory Device and Method for Storing and Reading a File System Structure in a Write–Once Memory Array," Christopher S. Moore, James E. Schneider, J. James Tringali, Roger W. Mar., U.S. Patent Application Ser. No. 09/877,719 filed Jun. 8, 2001.

"Modular Memory Devicee," J. James Tringali, P. Michael Farmwald, Thomas H. Lee, Mark G. Johnson, Derek J. Bosch, U.S. patent application Ser. No. 09/638,334 filed Aug. 14, 2000.

"Low–Cost Three–Dimensional Memory Array," Mark G. Johnson, Thomas H. Lee, Vivek Subramanian, P. Michael Farmwald, N. Johan Knall, U.S. patent application Ser. No. 09/928,969 filed Aug. 13, 2001.

International Search Report fro PCT/US03/19382, Dec. 5, 2003 (1 page).

* cited by examiner

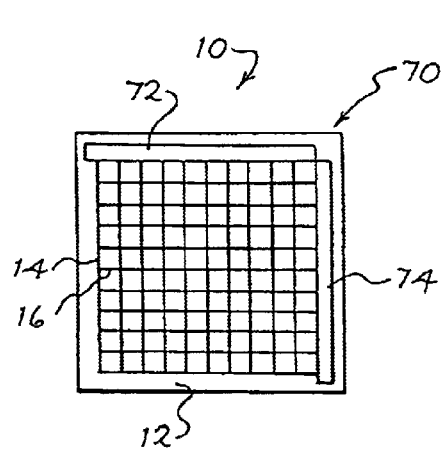
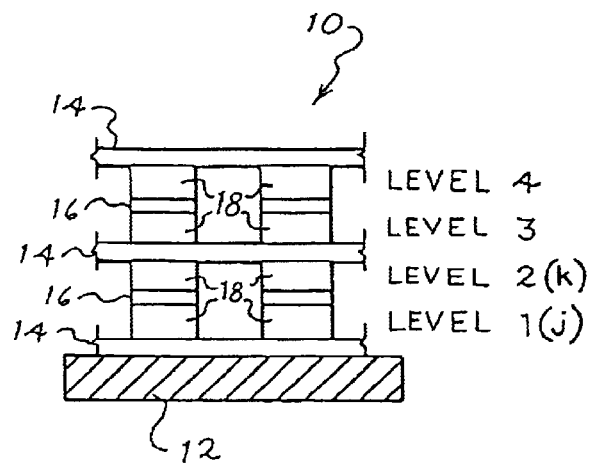
Fig. 1
Fig. 2
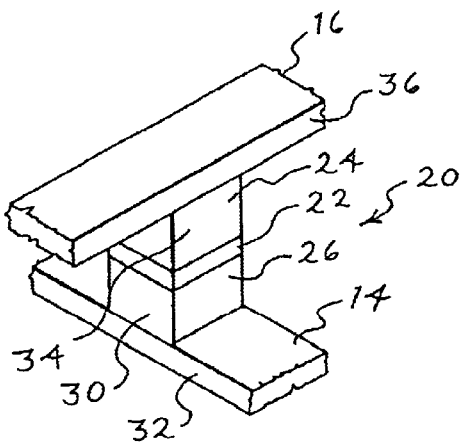
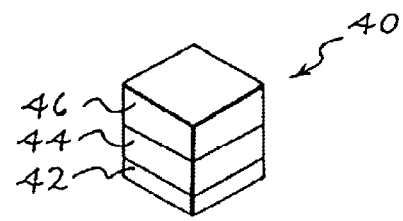
Fig. 3
Fig. 4

MULTIPLE-MODE MEMORY AND METHOD FOR FORMING SAME

BACKGROUND

This invention relates to solid-state integrated circuit memories, and in particular to improved solid-state integrated circuit memories that provide multiple models of operation.

Modern computing systems often include both read-only memory for boot up or archiving purposes and re-writable memory such as DRAM, flash, and magnetic disks. Typically, read-only memories are built and packaged separately from re-writable memories, and this increases system cost and complicates system assembly.

SUMMARY

By way of general introduction, the preferred embodiments described below relate to a multiple mode memory that includes both field-programmable write-once memory cells and field-programmable re-writable memory cells carried by the same integrated circuit substrate and addressed by the same I/O circuitry. In one non-limiting example, the multiple-mode memory is a three-dimensional memory having multiple, vertically-stacked layers of memory cells. Some of these layers include the write-once memory cells and others of the layers include the re-writable memory cells. In this way, both types of memory are provided on a single integrated circuit substrate. This reduces manufacturing cost and simplifies assembly of a computer system employing both types of memory cells. Additional types and numbers of types of memory cells can be used.

The foregoing sections have been provided by way of general introduction, and they are not intended to narrow the scope of the following claims.

BRIEF DESCRIPTION OF THE DRAWINGS

FIG. 1 is a top view of a multiple-mode memory that incorporates a presently preferred embodiment of this invention.

FIG. 2 is a fragmentary, schematic, cross-sectional view of the memory of FIG. 1.

FIG. 3 is a fragmentary isometric view of a write-once memory cell included in the memory of FIG. 1.

FIG. 4 is a schematic isometric view of another write-once memory cell suitable for use in the memory of FIG. 1.

DETAILED DESCRIPTION OF THE DRAWINGS

Figure 5:
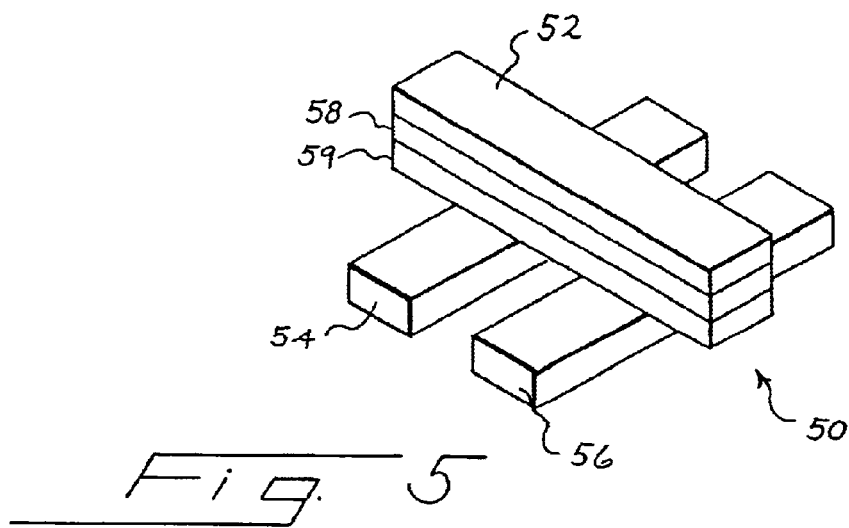
FIG. 5 is a schematic isometric view of a re-writable memory cell suitable for use in the memory of FIG. 1.

Turning now to the drawings, FIG. 1 shows a top plan view of a multiple-mode memory 10 that is formed on and carried by an integrated circuit substrate 12. As shown schematically in FIG. 1, the memory 10 includes an array of word lines 14 arranged orthogonally to an array of bit lines 16. Read and write voltages on the word lines 14 and the bit lines 16 are controlled by I/O circuitry 70 including X decoders 72 coupled to the word lines 14 and Y decoders 74 coupled to the bit lines 16.

FIG. 2 provides a fragmentary cross-sectional view that illustrates the arrangement of memory cells 18 between adjacent word lines 14 and bit lines 16. In this non-limiting example, the substrate 12 carries three levels of word lines 14 and two levels of bit lines 16. Memory cells 18 are formed at each crossing between adjacent word lines 14 and bit lines 16. In this non-limiting example, there are four levels of memory cells 18 (LEVEL 1, LEVEL 2, LEVEL 3, LEVEL 4) stacked vertically one on top of the other, and the memory 10 is a three-dimensional memory.

The memory cells 18 of FIG. 2 include both field-programmable write-once memories and field-programmable re-writable memories.

FIG. 3 provides a schematic illustration of a field-programmable write-once memory cell 20 which can be fabricated as described in U.S. Pat. Nos. 6,185,122 and 6,034,882 (Johnson et al.), which are assigned to the assignee of the present invention and are hereby incorporated by reference. In one example, the write-once memory cell 20 includes an anti-fuse layer 22 and first and second diode components 24, 26. The anti-fuse layer 22 may be formed of an insulator such as silicon dioxide, and the anti-fuse layer 22 is initially fabricated as an intact insulating layer that restricts the flow of current between the adjacent word line 14 and bit line 16. The diode components 24, 26 in this example are oppositely doped. When the anti-fuse layer 22 is breached by a sufficiently high-voltage write pulse, the diode components 24, 26 form a diode across the breached anti-fuse layer 22 limiting current flow across the memory cell 20 to a selected direction.

Note that in this example the memory cell 20 includes side walls 30 that are aligned with side edges 32 of the adjacent word line 14. This can be accomplished in a single photolithographic masking operation that patterns both the side walls 30 and the side edges 32 using a single mask to create the pattern. Similarly, the side walls 34 of the memory cell 20 are automatically aligned with the side edges 36 of the adjacent bit line 16 by a single photolithographic masking operation that creates the pattern for both the side walls 32 and side edges 36 in a single masking operation. Such automatic alignment techniques are described in detail in the above-identified Johnson patents, and they reduce the number of masking operations and therefore the cost of the multiple-mode memory 10.

The field-programmable write-once memory cells 20 are initially fabricated with an intact anti-fuse layer 22. In the field any desired one of the field-programmable write-once memory cells 20 can be written to the other binary logic state by applying a write pulse of sufficient voltage and power. Thus, the write-once memory cells 20 can be used as a field-programmable read-only memory, as for example for archiving and other user-initiated storage operations.

Many alternative structures can be used for the field-programmable write-once memory cells of the memory 10. For example, as shown in FIG. 4 the write-once memory cell 40 includes an anti-fuse layer 42 and two diode components 44, 46. The memory cell 40 differs from the memory cell 20 in that the diode components 44, 46 are both situated on the same side of the anti-fuse layer 42, while the diode components 24, 26 are situated on opposite sides of the anti-fuse layer 22.

FIGS. 3 and 4 provide only two examples of suitable write-once memory cells. Many alternatives are possible, including all of the memory cells described in U.S. patent application Ser. Nos. 09/560,626 and 6420215 09/814,727, which are assigned to the assignee of the present invention and are hereby incorporated by reference. As yet another alternative, the anti-fuse layers may extend continuously over multiple adjacent memory cells, as can the diode components. Diode components may not be required in all cases, and if used they may not require separate layers. For example, the diode components may be integrated into and formed by the adjacent word and bit lines, as for example when the word or bit lines comprise doped polysilicon conductors.

The multiple-mode memory 10 also includes field-programmable re-writable memory cells such as the memory cell 50 of FIG. 5. The memory cell 50 in FIG. 5 is a TFT-SONOS (thin film transistor, silicon-oxide-nitride-oxide-silicon) re-writeable memory cell. The memory cell 50 comprises a wordline 52 that acts as a gate, bitlines 54, 56 that act as sources/drains, an oxide-nitride-oxide (ONO) charge trapping medium 58 that alters the threshold voltage (Vt) of the thin film transistor (TFT), and a channel 59. With a TFT-SONOS re-writeable memory cell, one set of "rails" acts as bitlines and as dopant ("updiffusion") sources for the channel region of the TFT. Upon forming the bitlines (deposit stack, photomask, etch, gap fill, and perform a chemical-mechanical-polishing (CMP) operation flush to the silicon), the channel silicon is deposited, either as undoped amorphous and ion implanted, or in-situ doped as lightly P-type. The ONO charge trapping dielectric films are then deposited (similar film stacks are used in flash memory technology). Gates are then deposited and patterned. The sources/drains are formed by updiffusion of N-type dopants into the channel upon subsequent heat treatments. The device is written and erased in a fashion similar to flash memory (i.e., writing the cell involves trapping charge in the ONO film, altering the threshold voltage of the TFT). The TFT-SONOS memory cell and other suitable types of re-writeable memory cells are described in U.S. patent application Ser. No. 09/927,648, which is assigned to the assignee of the present invention and is hereby incorporated by reference.

The write-once memory cells 20, 40 and the re-writable memory cells 50 are included in the same three-dimensional memory array and are accessed by the same I/O circuitry 70. For example, in FIG. 2 the memory cells 18 are shown arranged in four vertically stacked levels. In one non-limiting example, any desired memory cell level j is fabricated of write-once memory cells 20, 40 without any re-writable memory cells 50. Any other desired memory cell level k includes only re-writable memory cells 50 without any write-once memory cells 20, 40. With this approach, any selected level of memory cells can be fabricated as either write-once memory cells or as re-writable memory cells, depending upon the particular application. Any number of combinations of write-once memory cells and re-writable memory cells can be achieved, and if desired both types of memory cells may be included within a single level. In this non-limiting example, the programming and read voltages, currents, and powers are similar for both the write-once memory cells 20, 40 and the re-writable memory cells 50. This allows the same logic and I/O circuitry 70 to be used for both types of memory cells.

The re-writable memory cell 50 described above can be formed with only a small number of additional processing steps as compared to the steps required for creating the write-once memory cells 20, 40. With this approach, specific levels of memory cells can be designated as write-once or re-writable during fabrication with little alteration to the mask set or the processing steps.

Figure 6:
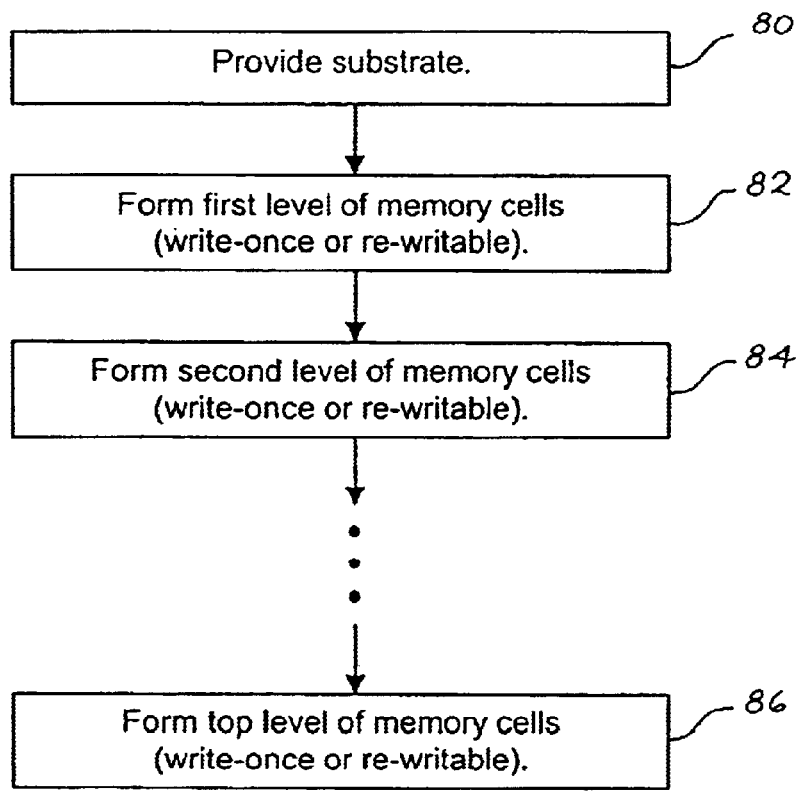
FIG. 6 is a flow chart of a method for forming portions of the memory of FIG. 1.

FIG. 6 provides a flow chart of a method for fabricating the memory 10 of FIG. 1. In block 80 an integrated circuit substrate is provided. Such a substrate typically includes a monocrystalline semiconductor wafer, as for example a monocrystalline silicon wafer. The term "integrated circuit substrate" as used herein as intended to refer to a substrate suitable for carrying an integrated circuit thereon, and an integrated circuit substrate does not include other types of substrates such as printed circuit boards on which circuits are separately formed and then mounted.

Returning to FIG. 6, in block 82 a first level of memory cells is formed overlying and carried by the substrate. This first level of memory cells can include write-once memory cells, re-writable memory cells, or some combination of both types of memory cells, as described above. In block 84 a second level of memory cells is formed overlying and vertically stacked above the first level of memory cells. The second level of memory cells can include write-once memory cells, re-writable memory cells, or some combination. Additional levels of memory cells may be added, and then in block 86 a top level of memory cells is formed, once again including any desired combination of write-once memory cells and re-writable memory cells.

The multiple-mode memories described above include both write-once and re-writable memory cells in a single three-dimensional memory array. This provides both re-writability and permanent data storage in an inexpensive, single chip solution.

Figure 7:
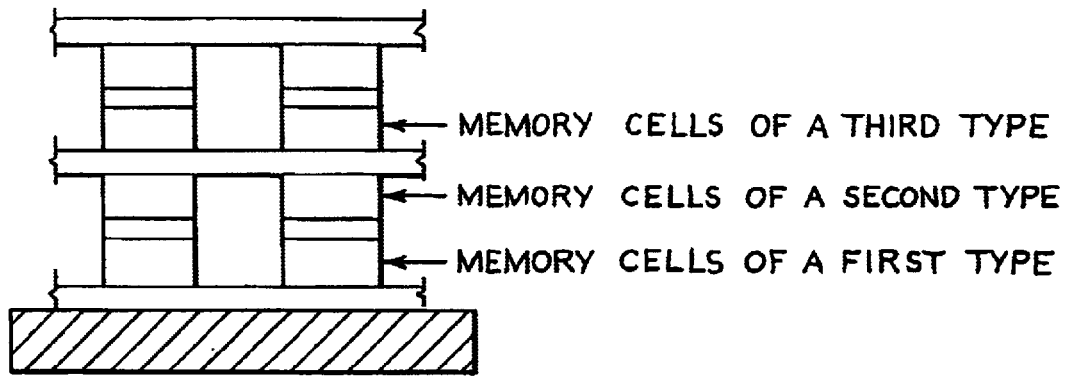
FIG. 7 is a fragmentary, schematic, cross-sectional view of a memory of a presently preferred embodiment having memory cells of three different types.
Figure 8:
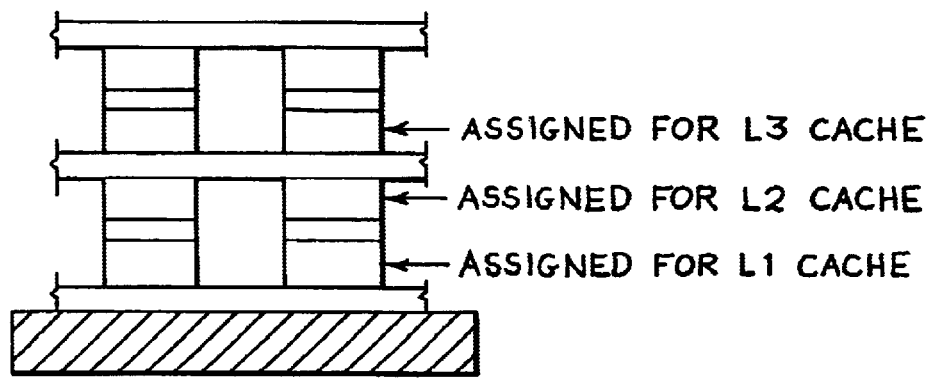
FIG. 8 is a fragmentary, schematic, cross-sectional view of a memory of a presently preferred embodiment in which memory cells are assigned to different levels (L1, L2, L3) of cache hierarchy.

While the preferred embodiments described above contained two types of memory cells (field-programmable write-once and field-programmable re-writable), it is important to note that there is no limit to the number of memory types that can be used. For example, FIG. 7 shows a memory having three different types of memory cells (memory cells of a first type, memory cells of a second type, and memory cells of a third type). A plurality of memory types can be used per die to resolve different memory requirements. For example, one die might contain two completely separate 3-D write-once cells, one cell programmed during manufacturing for register settings used by a controller and another updateable in the field to store data, such as a digital media file (e.g., pictures, songs). Additionally, the same die might contain multiple re-writeable memory cells (e.g., flash, 3-D memory, DRAM, SRAM) to store file system structures (such as a FAT table, root directory, or sub-directory) or data with different speed or access time requirements (e.g., the write and/or read times can vary). As data can be allocated for different performance requirements, a plurality of re-writeable cells may be used for different data types. Moreover, memory cells can be assigned for different levels of cache hierarchies (e.g., L1, L2, L3 cache) (see FIG. 8). U.S. patent application Ser. No. 10/186,356, which is assigned to the assignee of the present invention and is hereby incorporated by reference, describes caching embodiments that can be used with the multiple-mode memories of these preferred embodiments.

As indicated by the above examples, in some situations, two groups of memory cells can be of different types even if they are both write-once or rewritable. For example, two groups of write-once (or re-writable0 memory cells are of different types if they have different read and/or write times.

Different memory cells can be built into the two-dimensional substrate (as described in U.S. patent application Ser. No. 09/638,334, which is assigned to the assignee of the present invention and is hereby incorporated by reference) or in 3-D arrays as different cost and performance tradeoffs dictate. For example, faster memory can be built into the two-dimensional substrate, and slower memory can be built in the 3-D array. U.S. patent application Ser. No. 10/185,588, which is assigned to the assignee of the present invention and is hereby incorporated by reference, describes additional embodiments that can be used with the multiple-mode memories of these preferred embodiments.

As used herein, the term "carried by" is intended broadly to refer to layers or materials that are formed on an integrated circuit substrate. Layers that are carried by a substrate include layers that do not make physical contact with the substrate. For example, all of the memory cells shown in FIG. 2 are said to be carried by the substrate 12, even though the upper levels of memory cells are stacked above lower levels of memory cells.

As used herein, the term "overlie" is intended broadly to cover layers or films that overlie a structure either directly or indirectly. Again with reference to FIG. 2, the memory cells 18 are said to overlie the substrate 12, even though at least one word line is interposed between each memory cell and the substrate.

The term "field-programmable" indicates that a signal can be written into a memory cell in the field, after the memory cell has been fabricated and assembled into a working digital storage system. Thus, a mask-programmed read-only memory is not considered to be field-programmable as that term is used here.

The term "set" is intended broadly to include one or more.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A multiple-mode memory comprising:
an integrated circuit substrate;
a plurality of word lines;
a plurality of bit lines crossing the word lines;
a plurality of memory cells, each memory cell coupled between a respective word line and a respective bit line, the word lines, bit lines and memory cells included in a single integrated circuit carried by the substrate;
the memory cells comprising a plurality of field-programmable write-once memory cells and a plurality of field-programmable re-writable memory cells.

2. The invention of claim 1 wherein each field-programmable write-once memory cell comprises a respective anti-fuse layer.

3. The invention of claim 2 wherein each field-programmable write-once memory cell additionally comprises a respective pair of oppositely-doped diode components.

4. The invention of claim 3 wherein each anti-fuse layer is interposed between the diode components of the respective memory cell.

5. The invention of claim 1 wherein each memory cell comprises at least two opposed side walls auto-aligned with at least two side edges of the respective adjacent bit line.

6. The invention of claim 1 wherein each memory cell comprises at least two opposed side walls auto-aligned with at least two side edges of the respective adjacent word line.

7. The invention of claim 1 wherein the word lines are stacked in multiple levels, wherein the bit lines are stacked in multiple levels, and wherein the memory cells are stacked in multiple levels.

8. The invention of claim 7 wherein the memory cell levels comprise levels j and k, wherein level j comprises a plurality of the field-programmable write-once memory cells and none of the field-programmable re-writable memory cells, and wherein level k comprises a plurality of the field-programmable re-writable memory cells and none of the field-programmable write-once memory cells.

9. The invention of claim 1 further comprising:
I/O circuitry carried by the substrate and coupled both with the field-programmable write-once memory cells and with the field-programmable re-writable memory cells via the respective word lines and bit lines.

10. The invention of claim 1, wherein the plurality of field-programmable re-writable memory cells comprises TFT-SONOS re-writeable memory cells.

11. A method for forming a multiple-mode memory, the method comprising:
(a) providing an integrated circuit substrate;
(b) forming a set of first levels of field-programmable write-once memory cells carried by and overlying the substrate; and
(c) forming a set of second levels of field-programmable re-writable memory cells carried by and overlying the substrate;
the first and second levels of memory cells vertically stacked on the substrate in a three-dimensional memory array.

12. The method of claim 11 wherein (b) comprises:
(b1) forming a respective anti-fuse layer in each field-programmable write-once memory cell.

13. The method of claim 12 wherein (b) further comprises:
(b2) forming a pair of oppositely-doped diode components in each field-programmable write-once memory cell.

14. The method of claim 13 wherein each anti-fuse layer is interposed between the diode components of the respective memory cell.

15. The method of claim 11 wherein (b) comprises:
(b1) patterning at least two opposed side walls of a plurality of the field-programmable write-once memory cells and two side edges of an adjacent word line with a single photolithographic operation.

16. The method of claim 11 wherein (b) comprises:
(b1) patterning at least two opposed side walls of a plurality of the field-programmable write-once memory cells and two side edges of an adjacent bit line with a single photolithographic operation.

17. The method of claim 11, wherein the field-programmable re-writable memory cells comprise TFT-SONOS re-writeable memory cells.

18. A multiple-mode memory comprising:
an integrated circuit substrate;
a plurality of word lines;
a plurality of bit lines crossing the word lines;
a plurality of memory cells, each memory cell coupled between a respective word line and a respective bit line, the word lines, bit lines and memory cells included in a single integrated circuit carried by the substrate;
the memory cells comprising a plurality of memory cells of a first type and a plurality of memory cells of a second type;
wherein the memory cells of the first type comprise field-programmable write-once memory cells, and wherein the memory cells of the second type comprise field-programmable re-writable memory cells.

19. The invention of claim 18, wherein the memory cells of the first type have a different write time than the memory cells of the second type.

20. The invention of claim 18, wherein the memory cells of the first type have a different read time than the memory cells of the second type.

21. The invention of claim 18, wherein the memory cells of one of the first type and the second type are programmed during manufacturing, and wherein the memory cells of the other of the first type and the second type are programmed in the field.

22. The invention of claim 21, wherein the memory cells of one of the first type and the second type store register settings, and wherein the memory cells of the other of the first type and the second type store data.

23. The invention of claim 18, wherein the memory cells of one of the first type and the second type store a different data type than the memory cells of the other of the first type and the second type.

24. The invention of claim 23, wherein the memory cells of one of the first type and the second type store a file system structure, and wherein the memory cells of the other of the first type and the second type store a digital media file.

25. The invention of claim 23, wherein the memory cells of one of the first type and the second type are assigned a different level of cache hierarchy than the memory cells of the other of the first type and the second type.

26. The invention of claim 18, wherein the memory cells further comprise a plurality of memory cells of a third type.

27. The invention of claim 18, wherein the word lines are stacked in multiple levels, wherein the bit lines are stacked in multiple levels, and wherein the memory cells are stacked in multiple levels.

28. The invention of claim 18 further comprising:
I/O circuitry carried by the substrate and coupled both with the plurality of memory cells of the first type and the plurality of memory cells of the second type via the respective word lines and bit lines.

* * * * *